United States Patent
Park

(10) Patent No.: US 10,041,998 B2
(45) Date of Patent: Aug. 7, 2018

(54) METHOD OF DEBUGGING PLC BY USING GENERAL-PURPOSE MICROPROCESSOR

(71) Applicant: LSIS CO., LTD., Gyeonggi-do (KR)

(72) Inventor: Kang-Hee Park, Gyeonggi-do (KR)

(73) Assignee: LSIS CO., LTD., Anyang-si, Gyeonngi-Do (KR)

(*) Notice: Subject to any disclaimer, the term of this patent is extended or adjusted under 35 U.S.C. 154(b) by 20 days.

(21) Appl. No.: 15/331,623

(22) Filed: Oct. 21, 2016

(65) Prior Publication Data

US 2017/0115349 A1   Apr. 27, 2017

(30) Foreign Application Priority Data

Oct. 22, 2015   (KR) .................. 10-2015-0147155

(51) Int. Cl.
*G01R 31/30*   (2006.01)
*G01R 31/317*   (2006.01)
*G01R 31/3177*   (2006.01)

(52) U.S. Cl.
CPC ... *G01R 31/31705* (2013.01); *G01R 31/3177* (2013.01)

(58) Field of Classification Search
None
See application file for complete search history.

(56) References Cited

U.S. PATENT DOCUMENTS

| | | | | |
|---|---|---|---|---|
| 4,303,990 A | * | 12/1981 | Seipp | G05B 19/05 710/267 |
| 4,755,997 A | * | 7/1988 | Takahashi | G06F 11/3648 714/38.12 |
| 6,486,725 B2 | * | 11/2002 | Boggs | G06F 1/025 327/427 |
| 8,549,195 B2 | * | 10/2013 | Park | H04L 25/0264 710/48 |

FOREIGN PATENT DOCUMENTS

| | | | |
|---|---|---|---|
| EP | 1296248 A2 | * 3/2003 | ............ G06F 11/004 |
| EP | 2687928 A1 | 1/2014 | |
| JP | H11-65886 A | 3/1999 | |
| JP | 2000-215079 A | 8/2000 | |
| JP | 2007-249828 A | 9/2007 | |
| JP | 2007249828 A | 9/2007 | |
| JP | 2008204023 A | 9/2008 | |
| JP | 2013025347 A | 2/2013 | |
| JP | 2013084112 A | 5/2013 | |
| WO | 00/58857 A2 | 10/2000 | |

OTHER PUBLICATIONS

European Search Report dated Jan. 18, 2017 in counterpart application EP 16192825.4.

* cited by examiner

*Primary Examiner* — Mujtaba M Chaudry
(74) *Attorney, Agent, or Firm* — K&L Gates LLP

(57) ABSTRACT

Disclosed embodiments include a method of using a general-purpose microprocessor to debug a programmable logic controller. In some embodiments, the method includes: at a MPU of the PLC, backing up identification information and file information of an interrupt step of steps comprised in a user's program and substituting the interrupt step with an exceptional interrupt code to set the interrupt step for the debugging; and at the MPU of the PLC, interrupting the driving of the PLC at a step including the exceptional interrupt code in executing the user's program step by step while driving the PLC.

5 Claims, 4 Drawing Sheets

METHOD OF DEBUGGING PLC BY USING GENERAL-PURPOSE MICROPROCESSOR

CROSS REFERENCE TO RELATED APPLICATIONS

This application claims the benefit of Korean Patent Application No. 10-2015-0147155, filed on Oct. 22, 2015, entitled "METHOD OF DEBUGGING PLC BY USING GENERAL-PURPOSE MICROPROCESSOR", which is hereby incorporated by reference in its entirety.

BACKGROUND

1. Technical Field

The present disclosure relates to a system and method of using a general-purpose microprocessor to debug a Programmable Logic Controller (PLC), and, in particular, to a system and method of using a general-purpose microprocessor to debug a PLC, which uses a general-purpose Main Processing Unit (MPU) having no separate trace function unlike a dedicated Application-Specific Integrated Circuit (ASIC), to enable a user to interrupt a driving at a step set by the user, thereby effectively debugging the PLC.

2. Description of the Related Art

A Programmable Logic Controller (PLC) performs a function of interrupting operations of the PLC at a program step a user desires in the middle of executing a sequence program written by the user, to enable the user to check hitherto driving information, such that the user can easily detect errors in the user's program or data at a specific time point.

A personal computer (PC) performs operations of transmitting a debug command to the PLC via communications, the debug command containing a debugging interrupt step which the user may select arbitrarily, and reading various data from the PLC.

The PLC performs fundamental processing required to operate the PLC itself and, on the way of performing operations for executing compile codes, performs operations of interrupting the driving at a driving step transmitted from the PC and also resuming the driving according to instructions from the PC.

Upon receiving the interrupt step to interrupt the debugging from the PC, the PLC stores step's number of the interrupt step to interrupt the debugging in a buffer within the PLC. The PLC executes a debug check function every step when executing the user's program. The debug check function serves to determine whether a current driving step corresponds to the interrupt step stored in the buffer and allow the driving to be interrupted when the current driving step is determined to correspond to the interrupt step. The PLC having interrupted the driving at any function waits until it receives a driving resume instruction from the PC and resumes the driving from the interrupted step upon receiving the driving resume instruction.

Generally, an ASIC dedicated to the PLC is designed to include a TRACE function in H/W, wherein the TRACE function is a function of interrupting the driving at a particular step in the user's program and notifying this to the PLC.

However, the general-purpose MPU has no such a function, and hence contains an algorithm designed for the PLC to follow a debugging check routine every step. Therefore, a conventional debugging processing routine determines whether a current driving mode of the PLC is a debugging mode, interrupts the driving when the current driving mode is determined to be the debugging mode, and then waits until the next instruction is transmitted from the PC. The PLC resumes the driving from the next step of the currently interrupt step upon receiving the driving resume instruction.

A conventional debugging method executes the debugging processing routine of checking a debugging interrupt processing condition every driving step of the user's program and thus a processing time of the PLC increases for performing the branching and debug processing operations.

Further, the PLC repeatedly executes the debugging check routine not performed in the normal driving mode even when it drives in the debugging mode. Therefore, there is a possibility that unpredictable contaminant effects may occur and thus the PLC may be likely to not operate as in a driving mode.

SUMMARY

It is an aspect of some embodiments of the present disclosure to provide a method of using a general-purpose microprocessor to debug a PLC, wherein the method may perform a debugging processing operation only at a driving step set by a user without executing a debugging processing routine every driving step when performing a debugging of the PLC by using the general-purpose microprocessor, and as a result may simplify the debugging of the PLC and improve its performance.

Other objects of the present disclosure are not limited to the above-described object and other objects and advantages can be appreciated by the following description described with reference to the embodiments of the present disclosure.

In accordance with an aspect of some embodiments of the present disclosure, a method of using a general-purpose microprocessor to debug a programmable logic controller is provided, the method including, at a MPU of the PLC, backing up identification information and file information of a interrupt step of steps comprised in a user's program and substituting the interrupt step with an exceptional interrupt code (which may be referred to as exception or different interrupt code) to configure or set the interrupt step for the debugging; and at the MPU of the PLC, interrupting the driving of the PLC at a step including the exceptional interrupt code in executing the user's program step by step while driving the PLC.

The method may further include, at the MPU, resuming the driving of the PLC when the MPU completes the debugging.

The method may further include, at the MPU, receiving a PLC driving resume instruction from the PC in order to resume the driving of the PLC.

Setting the interrupt step for the debugging may include, upon receiving a interrupt step setting instruction from the MPU, backing up the step number and a compile code of the interrupt step in a temporal storage area of a data storage; and substituting the compile code of the interrupt step with an interrupt code in a compile code area.

Interrupting the driving of the PLC may include, while following an interrupt processing routine for the debugging, at the MPU, the processing the user's program step by step on the way of driving the PLC; at the MPU, reading a compile code area corresponding to each step to determine whether an exceptional interrupt has occurred depending on whether an exceptional interrupt code has been stored in the compile code area; at the MPU, determining whether a current mode is a debugging mode when the exceptional interrupt has occurred; and at the MPU, interrupting the driving of the PLC for the debugging when the current mode is determined to be the debugging mode.

The method may further include, at the MPU, resuming the driving when the debugging is completed and restoring the compile code, corresponding to the interrupt step, backed up in a temporal storage area of a data storage.

The method may further include, at the MPU, determining whether the current mode is the debugging mode, and executing a general exceptional interrupt processing when the current mode is determined to not be the debugging mode.

In accordance with another aspect of some embodiments of the present disclosure, since a compile code has been substituted with an exceptional interrupt of the MPU at any step set as a interrupt step for the debugging in driving the PLC, the exceptional interrupt of the MPU may be generated and an interrupt processing routine may be branched. Therefore, after checking only whether the current step is the debugging step, without the need of determining whether the current step is a interrupt step, the MPU 210 allows the driving of the PLC to be interrupted.

By doing so, some embodiments of the present disclosure may overcome the slow-down of a processing rate of the PLC or the problems in the prior debugging due to the concomitant effects caused by performing a function of checking whether a current driving step is a debugging step whenever every step is executed.

Some embodiments of the present disclosure perform the same operation as in a normal driving mode until an exceptional interrupt occurs, and thus can improve the processing rate and accuracy in debugging the PLC.

DETAILED DESCRIPTION

Figure 1:
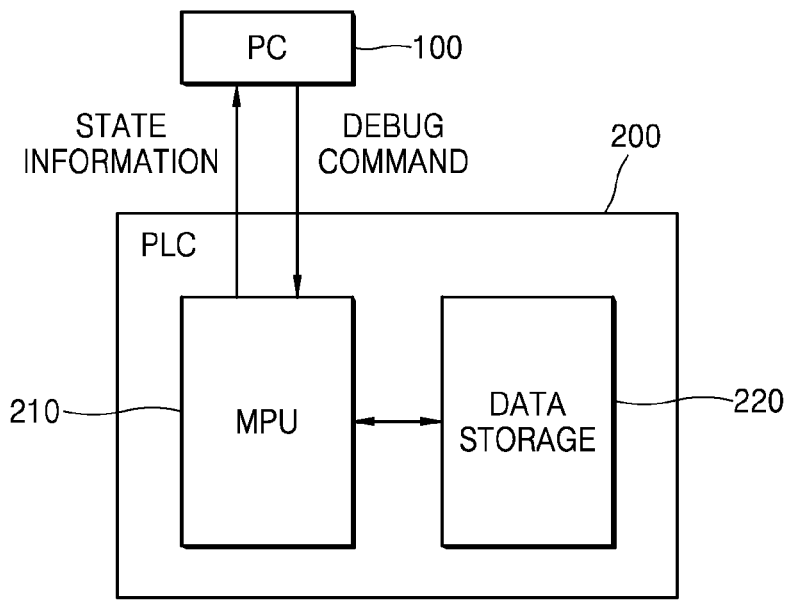
FIG. 1 is a block diagram of a system configuration for performing a method of using a general-purpose microprocessor to debug a programmable logic controller according to some embodiments of the present disclosure.

The present disclosure may be variously modified and include various embodiments. Therefore, some specific embodiments will be exemplified in the drawings by way of illustrations and be described in the detailed description below. However, this is not intended to limit the present disclosure to the specific embodiments and it is to be understood that they cover all modifications, equivalents, or alterations falling into the spirit and the scope of the present disclosure.

Hereinafter, embodiments according to the present disclosure will be described in detail with reference to the accompanying drawings.

FIG. 1 is a block diagram of a system configuration for performing a method of using a general-purpose microprocessor to debug a programmable logic controller according to some embodiments of the present disclosure.

Referring to FIG. 1, a personal computer (PC) performs operations of communicating with a programmable logic controller (PLC) 200 to transmit a debug command to a Main Processing Unit (MPU) 210 through communications (e.g., USB, serial, etc.) and receive state information from the MPU 210, thereby reading various data of the PLC 200, wherein the debug command comprises information with respect to a debug step which a user can choose at user's discretion.

The PC 100 can perform the debugging on the PLC in order to check an error in a user's program or data at a particular time point. To do so, the PC 100 may interrupt an operation of the PLC 200 at a program step, which a user desires on the way of executing a sequence program written by the user in the PLC 200, and enable the user to check hitherto driving information.

The PLC 200 includes the MPU 210 and a data storage 220. The MPU 210 communicates with the PC 100 to back up the step number of the interrupted step and a compile code of the interrupted step in the data storage 220 and substitutes the compile code with an exceptional interrupt code, thereby setting the interrupt step for the debugging.

The MPU 210 executes the user's program step by step in driving the PLC and, in turn, follows an interrupt processing routine at a step including the exceptional interrupt code, to interrupt the driving of the PLC for the debugging. Then the MPU 210 resumes the driving of the PLC when the debugging is completed through the communications with the PC 100.

The data storage 220 stores the driving data and the compile code which the sequence program written by the user is translated into a machine language for the operation in the MPU 210. The data storage 220 may include a RAM. The data storage 220 may include a compile code area of storing a compile code for each step and a temporal storage area.

Figure 2:
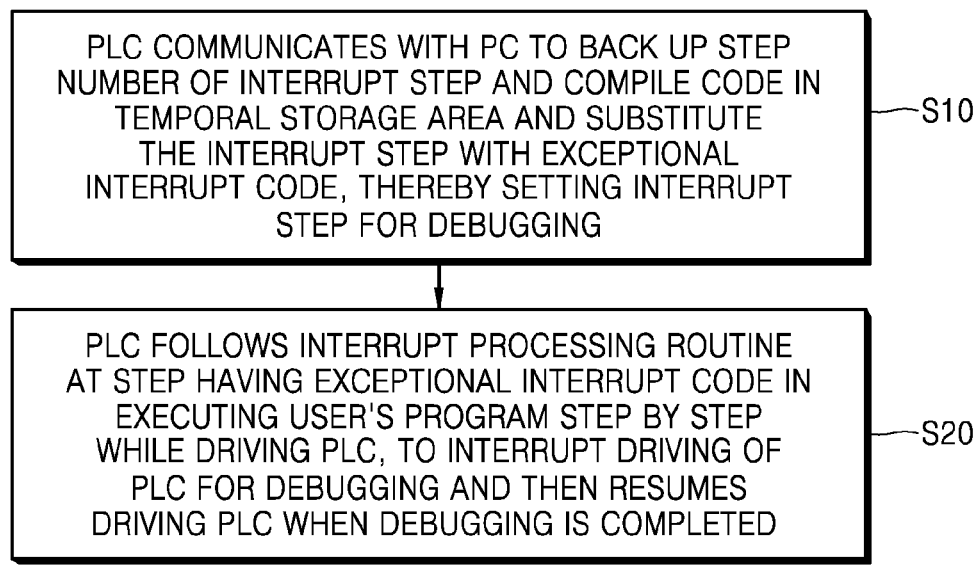
FIG. 2 is a flowchart for illustrating a method of using a general-purpose microprocessor to debug a programmable logic controller according to some embodiments of the present disclosure.

FIG. 2 is a flowchart for illustrating a method of using a general-purpose microprocessor to debug a programmable logic controller according to some embodiments of the present disclosure.

Referring to FIG. 2, the PLC 200 communicates with the PC 100 to, upon receiving a interrupt step setting instruction to set a interrupt step, back up the step number of the interrupt step and a compile code in the temporal storage area and substitute the interrupt step with an exceptional interrupt code, thereby setting the interrupt step for the debugging (S10).

Under a condition where the interrupt step for the debugging is set, the MPU 210 follows an interrupt processing routine at a step including the exceptional interrupt code in executing the user's program step by step while driving the PLC, to interrupt the driving of the PLC for the debugging and then resumes the driving the PLC when the debugging is completed (S20).

Figure 3:
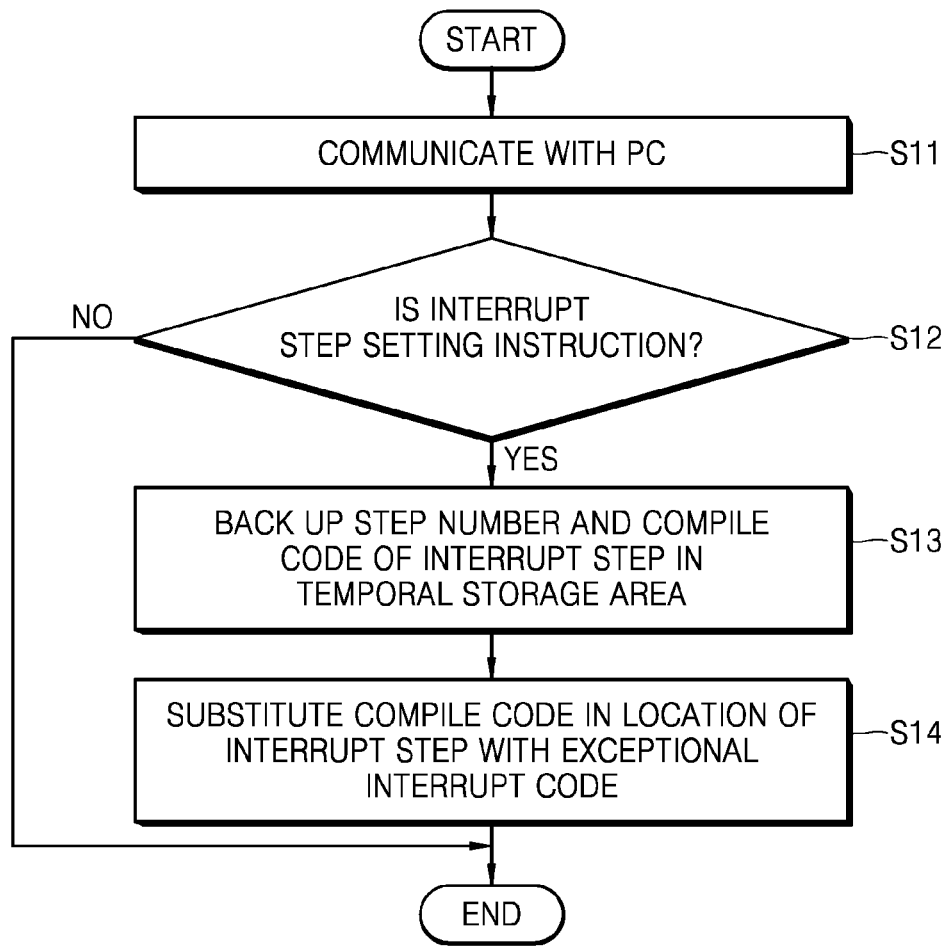
FIG. 3 is a flowchart for illustrating a process of setting a interrupt step in a method of using a general-purpose microprocessor to debug a programmable logic controller according to some embodiments of the present disclosure.
Figure 4:
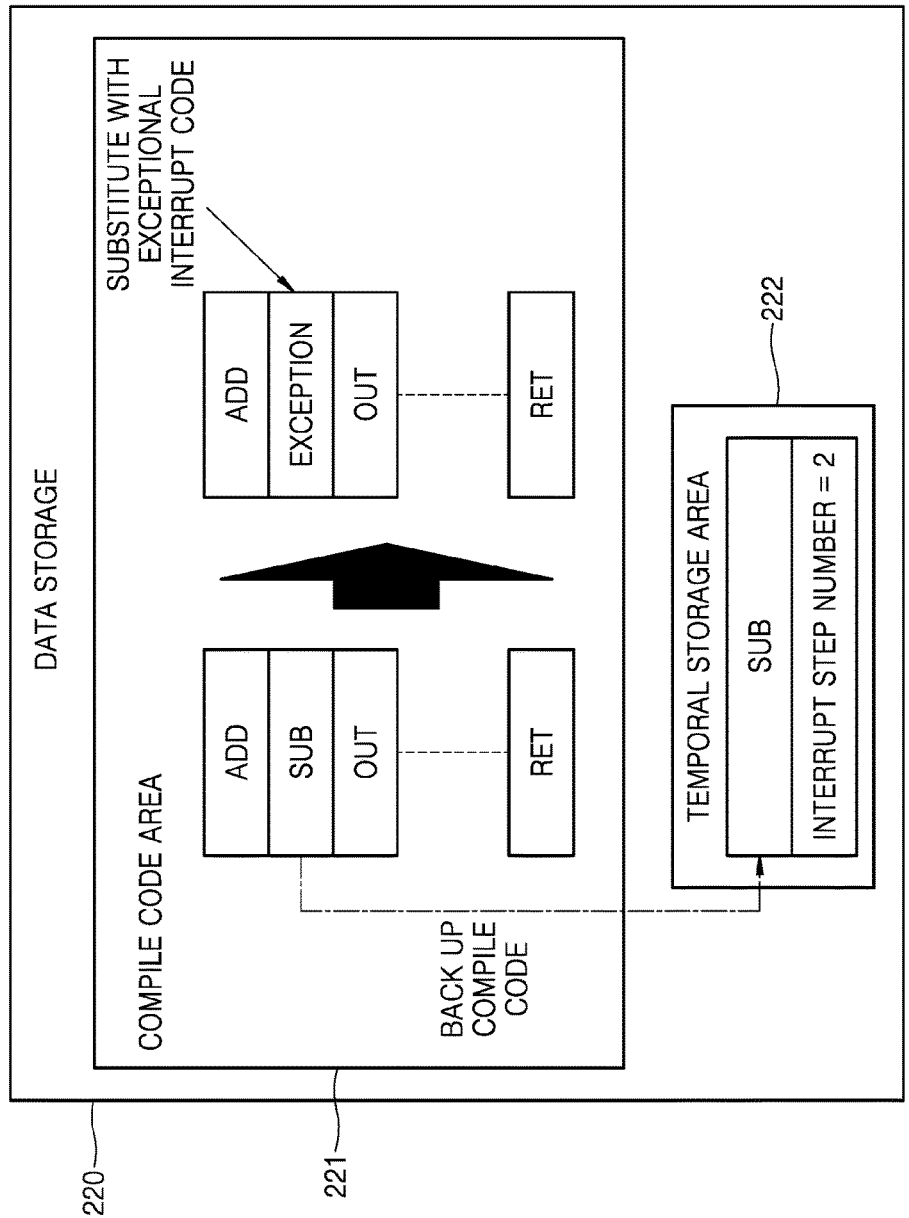
FIG. 4 is a block diagram for illustrating a process of backing up a compile code and substituting it with an exceptional interrupt code in a method of using a general-purpose microprocessor to debug a programmable logic controller according to some embodiments of the present disclosure.

FIG. 3 is a flowchart for illustrating a process of setting a interrupt step in a method of using a general-purpose microprocessor to debug a programmable logic controller according to some embodiments of the present disclosure. FIG. 4 is a block diagram for illustrating a process of backing up a compile code and substituting it with an exceptional interrupt code in a method of using a general-purpose microprocessor to debug a programmable logic controller according to some embodiments of the present disclosure.

Referring to FIG. 3, the MPU 210 of the PLC communicates with the PC 100 (S11). Therefore, the MPU 210 may receive a interrupt step setting instruction to set the interrupt step from the PC 100.

Thus, the MPU 210 determines whether the interrupt step setting instruction to set the interrupt step has been received from the PC 100 (S12).

When it is determined that the interrupt step setting instruction is received from the PC, the MPU 210 backs up the step number of the interrupt step and a compile code corresponding to the location of the interrupt step in the temporal storage area 222 of the data storage 220 (S13).

The MPU 210 does not store only the step number of the interrupt step, but also stores the compile code itself contained in the interrupt step in the temporal storage area 222.

For example, referring to FIG. 4, which shows an example of receiving the interrupt step setting instruction with respect to a second step, a compile code 'SUB' of the second step is stored in the temporal storage area 222 of the data storage 220.

Then, the MPU 210 substitutes the compile code corresponding to the location of the interrupt step in the compile code area 21 of the data storage 220 with an exceptional interrupt code (S14). That is, the compile code corresponding to the location of the interrupt step is substituted with the exceptional interrupt code which results in an exceptional interrupt in the MPU 210. For example, the exceptional interrupt code may comprise a machine language which generates a Non Maskable Interrupt (NMI) or Instruction Exception. However, the present disclosure is not limited thereto and exceptional interrupt codes used in each general-purpose MPU may be used.

In FIG. 4 which shows an example of receiving the interrupt step setting instruction for the debugging with respect to the second step, the MPU 210 substitutes the compile code 'SUB' of the second step in the compile code area 221 of the data storage 220 with an EXCEPTION code. Thereafter, the MPU 210 performs the normal driving of the PLC.

Figure 5:
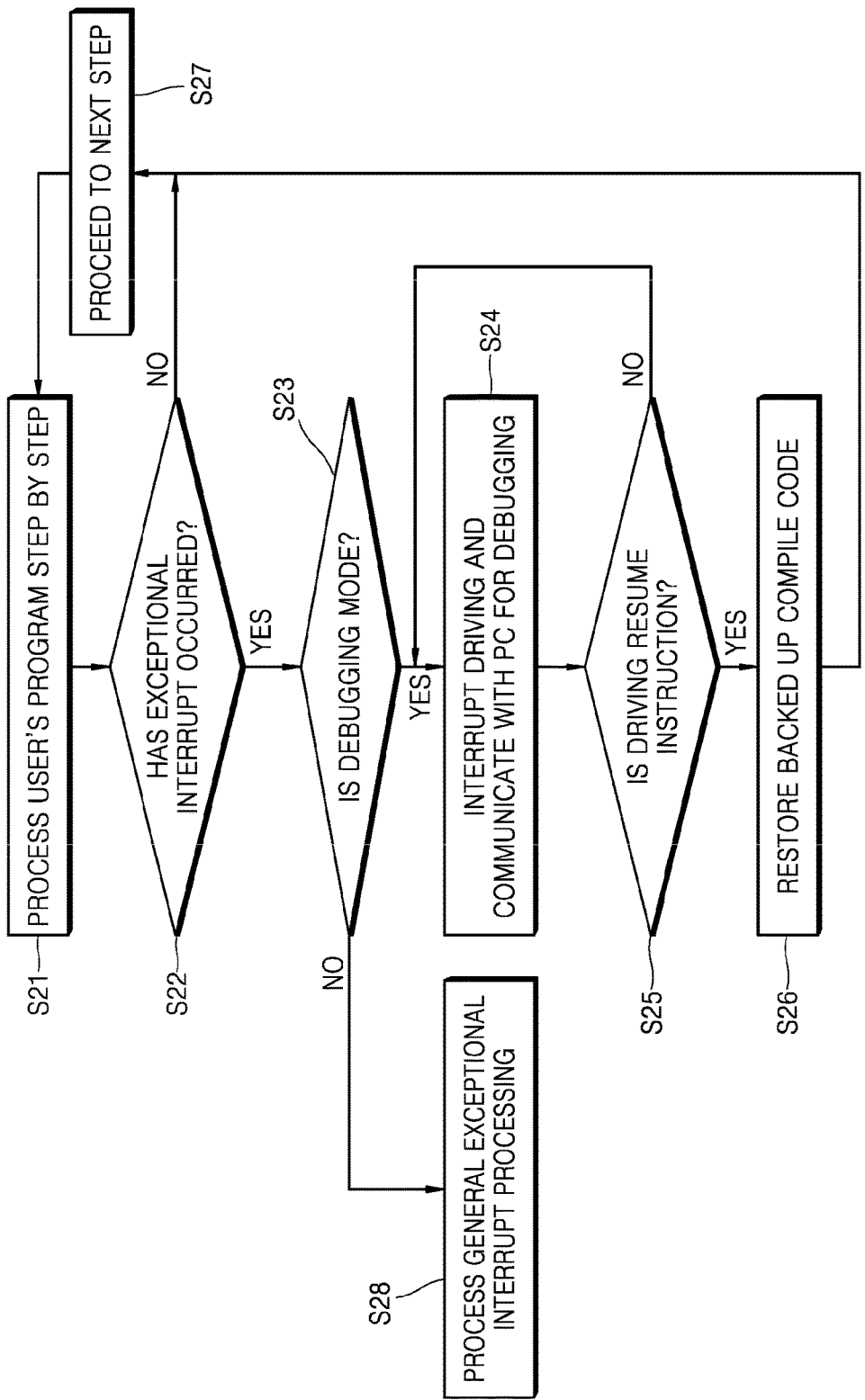
FIG. 5 is a flowchart for illustrating a process of performing an interrupt processing routine in a method of using a general-purpose microprocessor to debug a programmable logic controller according to some embodiments of the present disclosure.

FIG. 5 is a flowchart for illustrating a process of performing an interrupt processing routine in a method of using a general-purpose microprocessor to debug a programmable logic controller according to some embodiments of the present disclosure.

Referring to FIG. 5, the MPU 210 of the PLC 200 executes the user's program step by step (S21). The PLC 200 executes each step to read compile codes of every step and determine whether an exceptional interrupt has occurred (S22).

When it is determined that the exceptional interrupt occurred at any step, the MPU 210 determines whether a current driving mode is a debugging mode (S23). Determining whether a current driving mode is a debugging mode may be made with respect to the exceptional interrupt depending to whether there are the step number and the compile code of the interrupt step in the temporal storage area 222. For example, under a condition where the exceptional interrupt has occurred, the current driving mode is determined to be the debugging mode when the step number and the compile code of the interrupt step has been stored in the temporal storage area 222.

When the current driving mode is determined to be in the debugging mode, the MPU 210 interrupts the driving and communicates with the PC 100 for the debugging (S24). Accordingly, the PC 100 performs the debugging at the interrupt step in a state where the driving of the PLC 200 is interrupted.

The MPU 210 determines whether the driving resume instruction has been received from the PC 100 (S25).

When it is determined that the driving resume instruction has been received from the PC 100, the MPU 210 restores the compile code stored in the temporal storage area 222 (S26) and proceeds the next step (S27).

Otherwise, when it is determined in S23 that a current driving mode not is a debugging mode, the MPU 210 regards and processes the exceptional interrupt as a general exceptional interrupt (S23). That is, if the step number and the compile code of the interrupt step have been not stored in the temporal storage area 222, the MPU 210 determines that the general exceptional interrupt occurs, and processes a general exception interrupt processing.

As such, upon arriving at the second step on the way of the driving, a MPU exceptional interrupt is generated and an interrupt processing routine is branched since the compile code has been substituted with a code which allows an exceptional interrupt of the MPU 210 to occur.

Therefore, after checking only whether the current step is the debugging step, without the need of determining whether the current step is a interrupt step, the MPU 210 allows the PLC 200 to be interrupted. Thereafter, the MPU 210 waits while performing the communication with the PC 100. Also, upon receiving the driving resume instruction, it restores the primitive compile code of the interrupted step backed up in the temporal storage area 222 and then resumes the driving of the PLC 200.

Because the conventional debugging has to perform a function of checking whether a current driving step is a debugging step whenever every step is executed as described above, it may slow down a processing rate of the PLC or have problems due to concomitant effects caused by executing the function. Meanwhile, some embodiments of the present disclosure may perform the same operation as in a general driving mode until an exceptional interrupt occurs and thus can improve such a problem as described above.

While embodiments according to the present disclosure have been described above, they are non-exhaustive, and those skilled in the art will understand that various modifications and changes derived therefrom can be done within an equivalent range falling into the scope of the present disclosure. Therefore, the true technical scope of the present disclosure should be defined by the appended claims. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A method of using a general-purpose microprocessor to debug a programmable logic controller (PLC), the method comprising:
    backing up, via a main processing unit (MPU) of the PLC, a step number of an interrupt step and a compile code corresponding to the interrupt step in a temporal storage area of a data storage, wherein the MPU executes a user's program step by step while driving the PLC, wherein the user's program comprises a plurality of steps corresponding to a plurality of compile codes in a compile code area of the data storage, wherein the plurality of compile codes include the compile code corresponding to the interrupt step;
    substituting, via the MPU, the compile code in the compile code area of the data storage with an exceptional interrupt code to configure the interrupt step for debugging;
    interrupting, via the MPU, driving of the PLC at the interrupting step that corresponds to the exceptional interrupt code after the substitution; and
    resuming driving of the PLC when the MPU completes the debugging.

2. The method according to claim 1, further comprising: receiving, via the MPU, a PLC driving resume instruction from a personal computer (PC) in order to resume driving of the PLC.

3. The method according to claim 1, wherein interrupting driving of the PLC includes while following an interrupt processing routine for debugging:
    processing, via the MPU, the user's program step by step on the way of driving the PLC;
    reading, via the MPU, the compile code area to determine whether an exceptional interrupt has occurred depending on whether the exceptional interrupt code has been stored in the compile code area;
    determining, via the MPU, whether a current mode is a debugging mode when the exceptional interrupt has occurred; and
    interrupting, via the MPU, driving of the PLC for debugging when the current mode is determined to be the debugging mode.

4. The method according to claim 3, further comprising: resuming, via the MPU, driving when the debugging is completed and restoring the compile code corresponding to the interrupt step backed up in a temporal storage area of a data storage.

5. The method according to claim 3, further comprising: determining, via the MPU, whether the current mode is the debugging mode, and executing a general exceptional interrupt processing when the current mode is determined to not be the debugging mode.

* * * * *